United States Patent
Stephens et al.

(10) Patent No.: US 7,208,424 B2
(45) Date of Patent: Apr. 24, 2007

(54) METHOD OF FORMING A SEMICONDUCTOR DEVICE HAVING A METAL LAYER

(75) Inventors: Tab A. Stephens, Austin, TX (US); Brian J. Goolsby, Austin, TX (US); Bich-Yen Nguyen, Austin, TX (US); Voon-Yew Thean, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 185 days.

(21) Appl. No.: 10/943,383

(22) Filed: Sep. 17, 2004

(65) Prior Publication Data

US 2006/0063364 A1   Mar. 23, 2006

(51) Int. Cl.
 *H01L 21/302* (2006.01)
 *H01L 21/461* (2006.01)
(52) U.S. Cl. ............... 438/720; 438/734; 438/963; 257/E21.31; 257/E21.311; 257/E21.313
(58) Field of Classification Search ............... 438/720
 See application file for complete search history.

(56) References Cited

U.S. PATENT DOCUMENTS 5,948,703 A     9/1999 Shen et al.
6,651,678 B2 *  11/2003 Shintani et al. ............ 134/1.2
6,677,244 B2 *  1/2004  Ono et al. ................ 438/706
6,794,229 B2 *  9/2004  Asami et al. .............. 438/151
2003/0148622 A1 8/2003 Shen et al.

OTHER PUBLICATIONS http://www.clarycon.com/softlandingduria.html, "Softlanding During Gate Etching", 2004.*

* cited by examiner

*Primary Examiner*—David A. Zarneke
(74) *Attorney, Agent, or Firm*—Kim-Marie Vo

(57) ABSTRACT

A metal layer is formed over a metal oxide, where the metal oxide is formed over a semiconductor substrate. A predetermined critical dimension of the metal layer is determined. A first etch is performed to etch the metal layer down to the metal oxide and form footings at the sidewalls of the metal layer. A second etch to remove the footings to target a predetermined critical dimension, wherein the second etch is selective to the metal oxide. In one embodiment, a conductive layer is formed over the metal layer. The bulk of the conductive layer may be etched leaving a portion in contact with the metal layer. Next, the portion left in contact with the metal layer may be etched using chemistry selective to the metal layer.

13 Claims, 3 Drawing Sheets

METHOD OF FORMING A SEMICONDUCTOR DEVICE HAVING A METAL LAYER

FIELD OF THE INVENTION

This invention relates generally to semiconductor devices, and more specifically, to forming a metal layer.

BACKGROUND

Typically, polysilicon is used for gate electrodes and patterned using a multiple step process. In the multiple step process, a first anisotropic etch step quickly removes a first portion of the polysilicon. Next, an etch that is selective to the underlying dielectric layer removes a second portion of the polysilicon. This etch results in a tapered sidewall profile for the second portion of the polysilicon. To remove the tapering and silicon stringers left on the wafer, a third etch is performed. Some gases typically used are HBr, $CF_4$, $Cl_2$, $He/O_2$, and $O_2$.

As the semiconductor industry moves to high-performance devices, polysilicon depletion becomes a problem and needs to be minimized or eliminated. One way to address this need is to use a metal control electrode. However, the chemistries used for polysilicon do not work well for etching metal control electrodes while stopping on any underlying gate dielectric layer. Therefore, a need exists for a process for etching metal control electrodes, especially metal control electrodes over metal oxides.

BRIEF DESCRIPTION OF THE DRAWINGS

The present invention is illustrated by way of example and is not limited by the accompanying figures, in which like references indicate similar elements.

Figure 1:
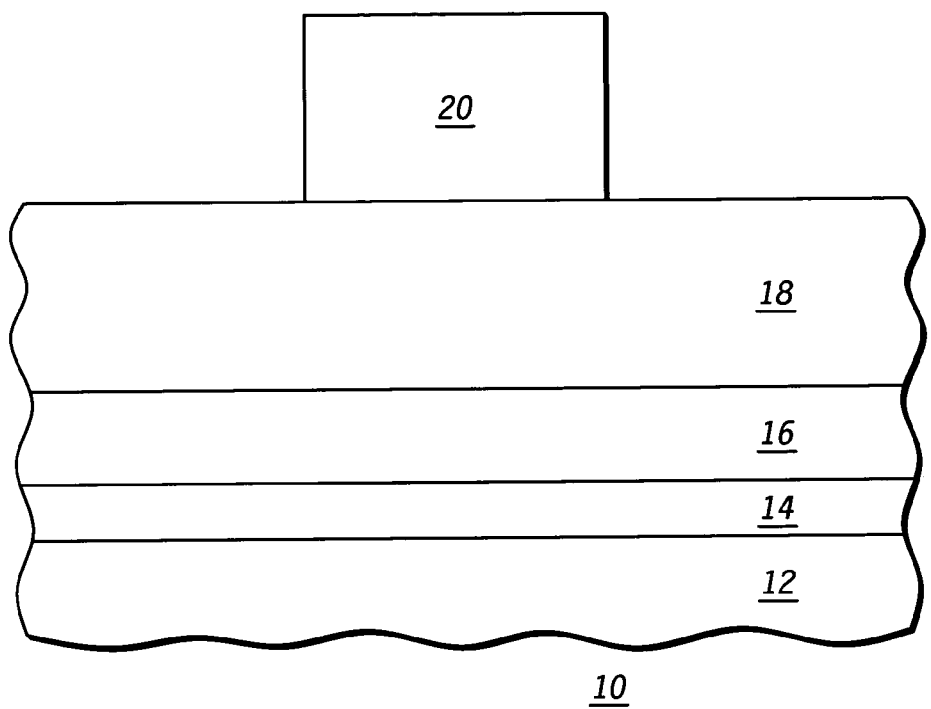
FIG. 1 illustrates a cross-section of a portion of a semiconductor device having a semiconductor substrate, a dielectric layer, a metal layer, an optional conductive layer and a mask in accordance with an embodiment of the present invention.

Skilled artisans appreciate that elements in the figures are illustrated for simplicity and clarity and have not necessarily been drawn to scale. For example, the dimensions of some of the elements in the figures may be exaggerated relative to, other elements to help improve the understanding of the embodiments of the present invention.

DETAILED DESCRIPTION OF THE DRAWINGS

The processes shown in FIGS. 1–6 illustrate a flow for forming a gate stack having a metal layer. The metal layer can be part of a gate structure on a fully depleted semiconductor-on-insulator (FDSOI) substrate, a dual metal gate structure, a finFET metal gate structure, a planar double gate structure, the like, and combinations of the above.

The metal layer is etched using a two-step process. In the first step most of the metal layer above the dielectric layer is removed. The second step controllably sets the bottom critical dimension (CD) of the metal layer and removes metal stringers. For example, in an embodiment where the metal layer is TaSiN and the dielectric is $HfO_2$, a fluorine-based etch is used in the first step to etch the TaSiN. This provides good selectivity to the $HfO_2$ and decreases sidewall residue, but causes taper (e.g., footings) in the TaSiN profile. For the second step, a chlorine-based etch completes the etch by controllably removing the sidewall taper and setting the CD of the TaSiN at the HfO2-TaSiN interface to fall within a predetermined range of CDs or for it to meet a predetermined CD. In one embodiment, a conductive layer, which may be polysilicon, is formed and patterned before patterning the metal layer. In one embodiment, a three-step approach is used to pattern the polysilicon layer. The three-step approach involves performing a main etch, a soft etch landing, and an over etch. In contrast, the two-step etch for the metal layer does not include all three of these and includes what can be viewed as a combined main etch and soft landing etch as a first step and an over etch as the second step. Due to the combined metal and soft landing etch there is no bulk etch of the metal layer with poor selectivity to the underlying dielectric followed by a soft landing etch that causes a taper and has good selectivity to the underlying dielectric layer. Instead, during the combined metal and soft landing etch the sidewalls are becoming tapered. The second etch (the over etch) is then used to decrease the tapering and control the critical dimension (CD) of the layer.

The etch processes discussed herein can be wet or dry and if dry, purely chemical, purely physical, or a combination of the two, such as RIE (reactive ion etch). In the embodiment described, all etches are dry RIE etches because this process is preferred since it has benefits of both the purely chemical and purely physical process. In the embodiment described with respect to the figures, an Applied Materials Centura 5200 decoupled plasma source (DPS) tool is used; however, other tools may be used. For the DPS tool, an inductively coupled source with independent bias power control is preferred because the tool gives the operator the ability to control independently the plasma formed during the RIE etch by varying source and bias power independently. This control provides for straighter profiles and better critical dimension (CD) control than other operating modes. A skilled artisan should recognize that if other tools, especially those made by another manufacturer, are used the settings may vary from those described herein. More specifically, the amount of self-bias and applied bias may change depending on the tool and the mode used. A better understanding of the process can be attained from the figures and associated discussion.

All quantities of chemicals discussed are for 200 mm wafers whether silent to this or expressly stated herein. A skilled artisan should recognize that the amounts would change, such as doubling, for 300 mm wafers. Also, the quantities may change depending on the tool and other factors, such as the materials used.

Illustrated in FIG. 1 is a portion of a semiconductor device 10 having a semiconductor substrate 12, a dielectric layer 14, a metal layer 16, a (optional) conductive layer 18; and a mask 20. The semiconductor substrate 12 can be any semiconductor material or combinations of materials, such as gallium arsenide (GaAs), silicon germanium (SiGe), germanium (Ge), semiconductor-on-insulator (SOI) (e.g., fully depleted SOI (FDSOI), silicon-on-insulator, etc.), silicon (Si), gallium nitride (GaN), indium phosphide (InP), the like, and combinations of the above.

In a preferred embodiment, the dielectric layer 14 is a high dielectric constant (hi-k) dielectric or a combination of materials, where at least one of the materials is a hi-k dielectric. As used herein, a hi-k material is a material which has a dielectric constant (k) greater than that of silicon dioxide or more specifically, greater than that of stoichiometric silicon nitride. Any hi-k dielectric may be used, such as hafnium oxide, zirconium oxide, the like, and combinations of the above. In one embodiment, the dielectric layer 14 includes silicon dioxide or the like. For example, the dielectric layer 14 may be hafnium oxide with an underlying layer of silicon dioxide, which may be a native silicon dioxide.

The metal layer 16 forms at least a portion of the control (e.g., gate) electrode of the semiconductor device 10 and may be the entire control electrode if the conductive layer 18 is not present. In one embodiment, the metal layer 16 is approximately two hundred Angstroms of TaSiN or TiN. Because the metal layer 16 is in contact with the gate dielectric layer 14, the material chosen for the metal layer 16 sets the work function for the semiconductor device 10. In one embodiment, the metal layer 16 includes a metal nitride; in one embodiment, the metal layer 16 includes a metal silicon nitride.

The conductive layer 18 is optional. The conductive layer 18 may be present and form part of the control electrode in conjunction with the metal layer 16. In one embodiment, the conductive layer 18 includes silicon (e.g., polysilicon, amorphous silicon, or amorphous silicon germanium) or another conductive material, such as a metal or conductive oxide. It may be desirable to have the conductive layer 18 be present for subsequent processing, such as interconnect formation. In one embodiment, the conductive layer 18 is polysilicon, and subsequent processing that is compatible with polysilicon gate electrodes may be used. This would avoid the cost in money and time of having to develop and qualify new processes. Therefore, for purposes of the embodiment shown in the figures the conductive layer 18 is present and is polysilicon. However, other embodiments may use different materials for the conductive layer 18 or not use the conductive layer 18 at all.

In another embodiment, it may be desirable for the conductive layer 18 to be a metal layer 16 for ease of integrating NMOS and PMOS metal gate transistors on the same substrate. One of the transistor types may only have the conductive layer 18 as a control electrode and the other transistor type may have both the metal layer 16 and the conductive layer 18, as a control electrode. This would simplify processing for embodiments where integration of NMOS and PMOS metal gate transistors are desired.

The mask 20 can be any suitable mask, such as photoresist over a spin-on ARC. Hardmasks, including sacrificial dielectrics like TEOS (tetraethylorthosilane) or silicon nitride, may also be used for the mask 20. For example, the mask can be a photoresist layer that has been patterned to the shape shown in FIG. 1. A skilled artisan recognizes how to form and pattern masks, especially photoresist masks. If the conductive layer 18 is not present, then the mask 20 should be thicker than in the situation where the conductive layer 18 is present to protect the metal layer 16 during etching of the metal layer 16 because the metal layer 16 has an increased thickness requirement to form the control electrode.

Figure 2:
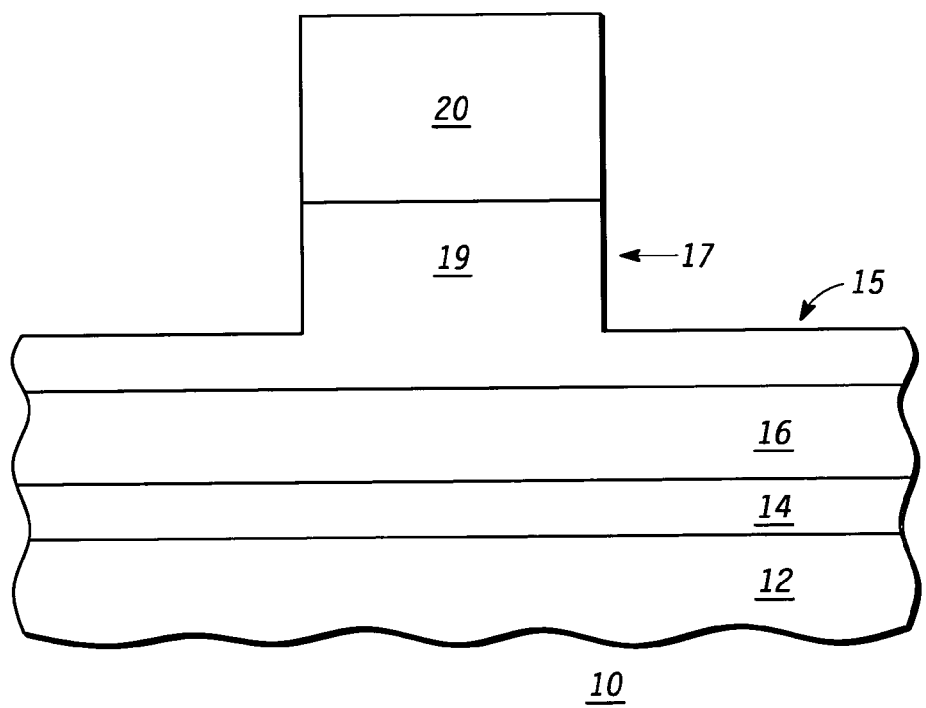
FIG. 2 illustrates the semiconductor device of FIG. 1 after patterning a portion of the conductive layer in accordance with an embodiment of the present invention.

As shown in FIG. 2, the mask 20 is used to pattern the conductive layer 18 if the conductive layer 18 is present. In a preferred embodiment, a first etch is performed to form a partially patterned conductive layer 19, which has a bulk portion 17 and a residual portion 15. The bulk portion 17 has a thickness greater than the residual portion 15. The partially patterned conductive layer 19 is formed by patterning a first or bulk portion of the conductive layer 18. The first etch is performed quickly so that a large amount or bulk of the conductive layer 18 is etched quickly, thereby increasing processing throughput. The residual portion 15 is not significantly etched during the first etch process. If the conductive layer 18 is polysilicon, the first etch can be performed using a plasma having approximately 100 sccm of HBr, approximately 25 sccm of $CF_4$ and approximately 60 sccm of $Cl_2$. The total gas flow of HBr plus $Cl_2$ is may be fixed, with the HBr to $Cl_2$ ratio changing to alter the amount of sidewall passivant in the process. In one embodiment, ratios of HBr:$Cl_2$ from 120:40 to 40:120 are used. Also, the total gas flow of HBr plus $Cl_2$ may be changed to affect the gas residence time within the chamber. In one embodiment, approximately 0 to 50 sccms of $CF_4$ is used. The $CF_4$ may be used to address differences in etch rates between silicon structures with different doping levels. In addition, approximately 16 sccm of He/$O_2$, in one embodiment with 30% $O_2$ in He mix may be present to control passivant formation, including feature density dependences. In one embodiment, approximately 0 to 30 sccm of He/$O_2$ may be used. HBr, $CF_4$ and $Cl_2$ are desirable because the HBr physically etches the polysilicon creating a sidewall polymer, the $Cl_2$ etches anisotropically, and the $CF_4$ also etches anisotropically and etches polysilicon at a fast etch rate. However, any other suitable chemistry, such as any other fluorine or chlorine chemistry may be used, especially if a different material is used. In addition, a high bias power of approximately 75 to 100 Watts may be used to increase the speed of the etch. In one embodiment, the source power for this etch process, as well as all etch processed described herein, may be approximately 200 to 1200 W, with higher source power used to increase ion density as needed.

Figure 3:
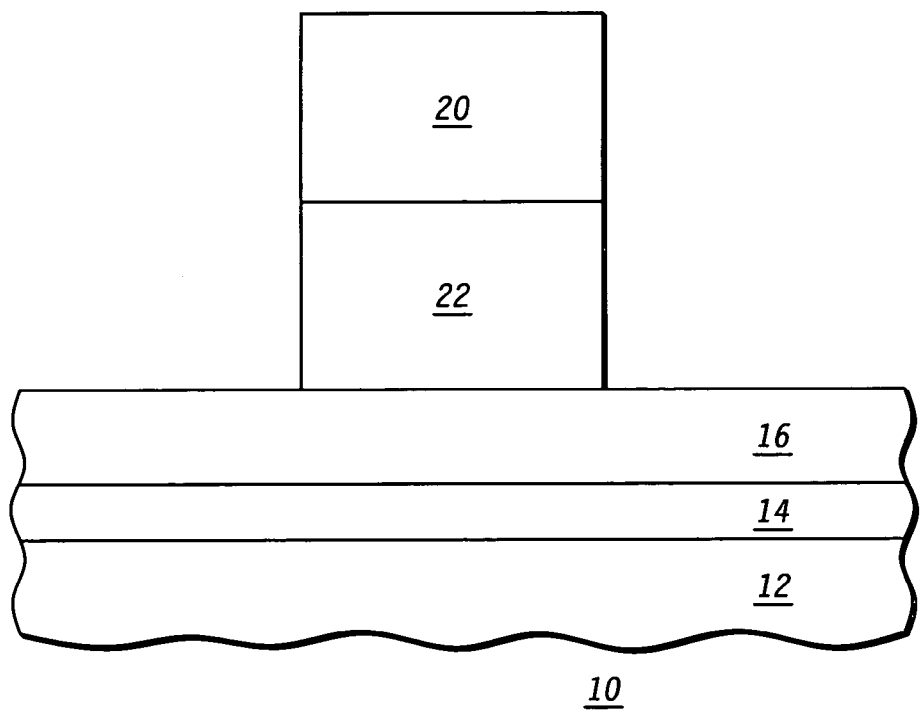
FIG. 3 illustrates the semiconductor device of FIG. 2 after patterning another portion of the conductive layer in accordance with an embodiment of the present invention.

After performing the first etch, which may be termed a main etch, a second etch or soft landing etch may be performed to pattern the residual portion 15 to form a patterned conductive layer or top electrode 22 and expose the metal layer 16, as shown in FIG. 3. The second etch has a slower etch rate than the first etch to avoid damaging the underlying metal layer 16. To decrease the etch rate for the second etch step relative to the main etch, $Cl_2$ and $CF_4$ which etch polysilicon quickly are not used and the bias power is reduced. In one embodiment, the bias power is approximately 10–30 Watts. In one embodiment, approximately 50 to 200 sccm, or more specifically approximately 100 sccm, of HBr and approximately 0 to 20 sccm, or more specifically approximately 6 sccm, of He/$O_2$ are used in the plasma; however, any other suitable chemistry can be used. For example, small amounts of $Cl_2$ may be added to control a silicon profile and feature loading. The HBr physically etches the polysilicon creating a sidewall polymer along the newly formed portions of the patterned conductive layer's 22 sidewalls. Thus, from both the main etch and the soft landing etch the sidewalls of the patterned conductive layer 22 have polymers formed thereon. The presence of a sidewall polymer on the patterned conductive layer is desirable to protect the patterned conductive layer from etch chemistries used to subsequently etch the metal layer 16. The He/$O_2$ controls passivant formation and in some embodiments provides an oxygen source for implantation through underlying layers of very thin oxide. The formation of additional oxide through implantation increases the effective selectivity of the etch process to the underlying material and prevents pitting the underlying material's surface. However, this second feature is may not be used for sufficiently thick metal oxides, such as $HfO_2$, due to their greater inherent etch selectivity. Also, while it may be used in some applications, oxygen implantation is usually undesirable due to increased source/drain silicon recess.

After the second or soft landing etch, a third etch, which can be termed an over etch, is preferably performed to remove any portions of the conductive layer 18 that may remain (not shown) on the metal layer 16. The over etch is designed to prevent pitting of the metal layer 16 so that the integrity of the metal layer 16 is not destroyed. In one embodiment, the over etch is performed using a plasma with a chemistry having approximately 0 to 20 sccm, or more specifically approximately eight sccm of $He/O_2$ and approximately 50 to 200 sccm, or more specifically approximately 100 sccm of HBr. In one embodiment, a bias power of approximately 50 to 150 Watts, or more specifically approximately 90 Watts is used. The pressure of the over etch step may be increased compared to the first and second etch so that the etch is more isotropic. For example, while the soft landing etch may have a pressure of approximately four to 35 mT, or more specifically 25 mT, the over etch may have a chamber pressure of approximately 35 to 70 mT, or more specifically 65 mT.

Figure 4:
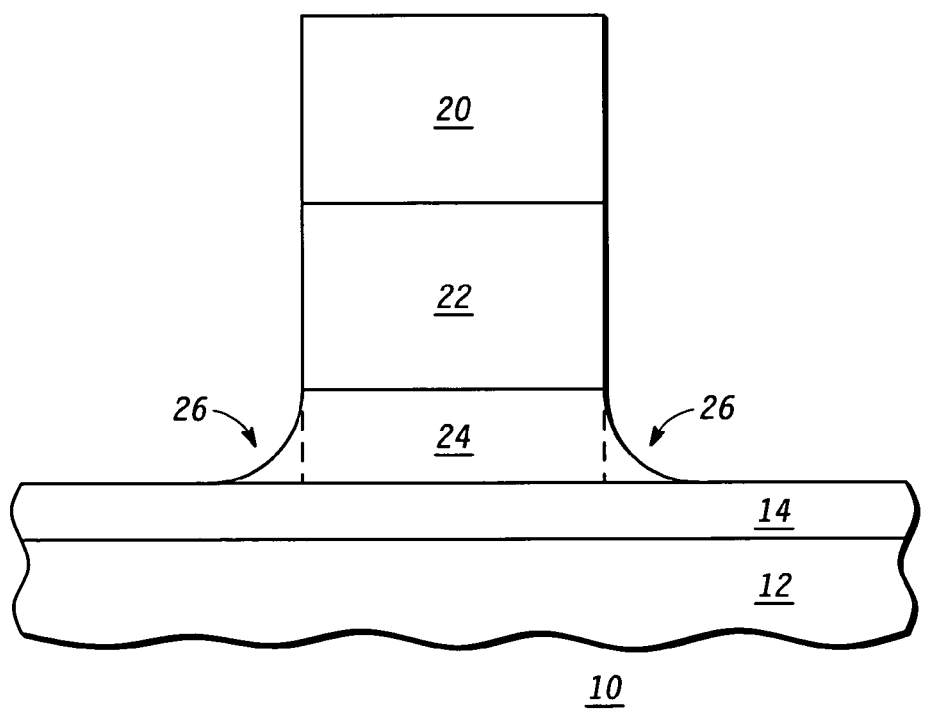
FIG. 4 illustrates the semiconductor device of FIG. 3 after performing a first etch to etch the metal layer in accordance with an embodiment of the present invention.

After patterning the conductive layer 18 to form the (optional) top electrode 22, the metal layer 16 is etched using a two-step etch process where the patterned conductive layer 22 or the mask 20 are used as a mask. The metal layer 16 is in direct contact with the dielectric layer 14 and therefore during the etching, the process for etching the metal layer 16 must be careful not to damage the dielectric layer 14. As shown in FIG. 4, the first etch step results in footings 26 being formed along the sidewalls of a patterned metal layer 24. In one embodiment, the footings 26 are formed at the bottom portion of the patterned metal layer 24 and in contact with the dielectric layer 14. To pattern the metal layer 16 and form the a patterned metal layer 16 and the footings 26, a chemistry including fluorine (F) is used. In one embodiment, the chemistry includes approximately 25 to 250 sccm of $CF_4$ for 200 mm wafers. One skilled in the art should recognize that for 300 mm wafers because the chamber is larger in size the amount of $CF_4$ will approximately double. Thus, for 300 mm claims 50 to 500 sccm of $CF_4$ may be used. Fluorine is desirable to be used because it has high selectivity to the underlying dielectric layer 16 if the dielectric layer 16 is $HfO_2$. In addition, fluorine produces less sidewall residue than using $Cl_2$. In addition, fluorine creates the desired footings 26. Although fluorine etches polysilicon, the prior polysilicon etching steps created passivation along the sidewalls of the patterned conductive layer 22 to prevent additional sidewall etching if the conductive layer 18 is present and is polysilicon. In addition, the presence of chlorine aids in protecting the sidewalls of the patterned conductive layer 22 if the patterned conductive layer 22 is polysilicon and the metal layer 16 is TaSiN because chlorine reacts with the TaSiN to create a volatile species that puts residue on the sidewalls of the polysilicon. In one embodiment, nitrogen or other dilutants may be added to the chemistries to slow down the etch rate, if desired.

Since it is desirable to control the anisotropy of the etch an inert gas, such as Ar, may be introduced into the chamber to dilute the fluorine-including chemistry while maintaining a predetermined pressure. In one embodiment, the pressure is approximately 3 to 10 milliTorr. In one embodiment, the amount of inert gas is at most approximately 50% of the total gas flow. Thus, in one embodiment, the amount of inert gas may be approximately equal to the amount of fluorine-including chemistry. In another embodiment, no inert gas may be present.

In one embodiment, the source power is approximately 200 to 1000 Watts. The etch can be a timed etch or performed using endpoint control. In one embodiment, the first etch of the two-step etch process is approximately 20 seconds.

Figure 5:
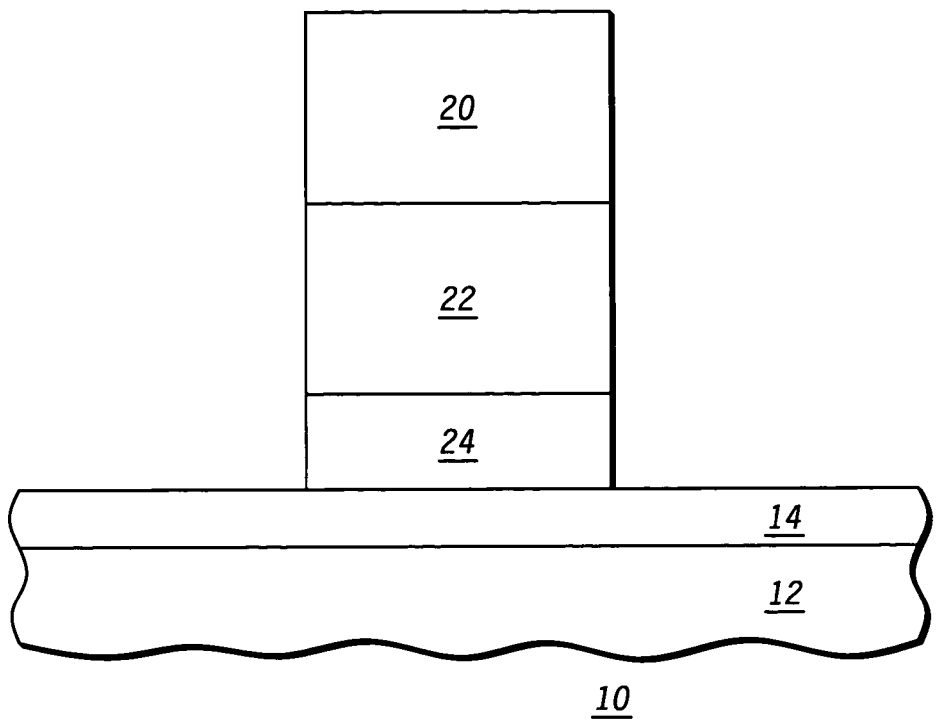
FIG. 5 illustrates the semiconductor device of FIG. 4 after performing a second etch to remove the footings in accordance with an embodiment of the present invention.

After forming the footings 26, they are removed using a second etch so that only the patterned metal layer 24 remains, as shown in FIG. 5. The patterned metal layer 24 is the bottom control electrode if the top control electrode 22 is present and if the top electrode 22 is not present, the patterned metal layer 24 is the control (e.g., gate) electrode. The etch will get rid of the footings 26, achieve the predetermined CD, and remove any other residue on the wafer, such as metal stringers, if present. The chemistries chosen need to be sufficiently selective to the underlying dielectric layer. Because the bulk of the metal layer is already removed, the chemistry can be less selective to the dielectric layer then if a larger amount of the metal layer needed to be etched like, for example, in a single step metal etch.

To remove the footings 26, a chemistry including chlorine (Cl) is used. In one embodiment, the chemistry includes approximately 20 to 150 sccm of $Cl_2$ for 200 mm wafers. One skilled in the art should recognize that for 300 mm wafers because the chamber is larger in size the amount of $Cl_2$ will approximately double. Thus, for 300 mm wafers 40 to 300 sccm of $Cl_2$ may be used. Chlorine can form non-volatile residues along the sidewalls of the metal and polysilicon, but the second etch process is short, limiting the amount of exposure of the metal stack to the chlorine so that the chlorine achieves the desirable results. In one embodiment, the second etch duration is approximately eight seconds.

HBr may be added to the second etch to dilute the chlorine-including gas to help control the etch rate by acting as an etch block. In one embodiment, the amount of HBr is approximately zero to at most approximately 50% of the total gas flow. Thus, in one embodiment, the HBr may be approximately equal to the amount of chlorine-including chemistry.

In one embodiment, the source power is approximately 200 to 1000 Watts. Preferably, the second etch is a timed etch because it is a clean-up step. In one embodiment, the second etch is shorter in time than the first etch. In one embodiment, the pressure is approximately 3 to 10 milliTorr.

In addition, the bias power should be low. The lower the bias power the less likely that residue is formed on the sidewalls of the layer being etched. Both processes have low bias power because it is desirable to prevent residue from forming on the sidewalls of the metal layer during etching of the metal layer because the clean up process to remove the residue may damage the metal layer. The bias power for the second etch can be greater than, less than or equal to the bias power used in the first process. In one embodiment, the bias power should be less than or equal to approximately 30 Watts. The low bias power provides sufficient physical sputtering to make the etch work without extra sidewall roughness and without damaging the underlying dielectric layer 14. The bias power should not be too great as to cause implanting of oxygen through the dielectric layer 14 into the substrate because this can result in an increase in source/drain recesses when the oxide is removed during subsequent etching of the semiconductor substrate 12 for source/drain formation.

Figure 6:
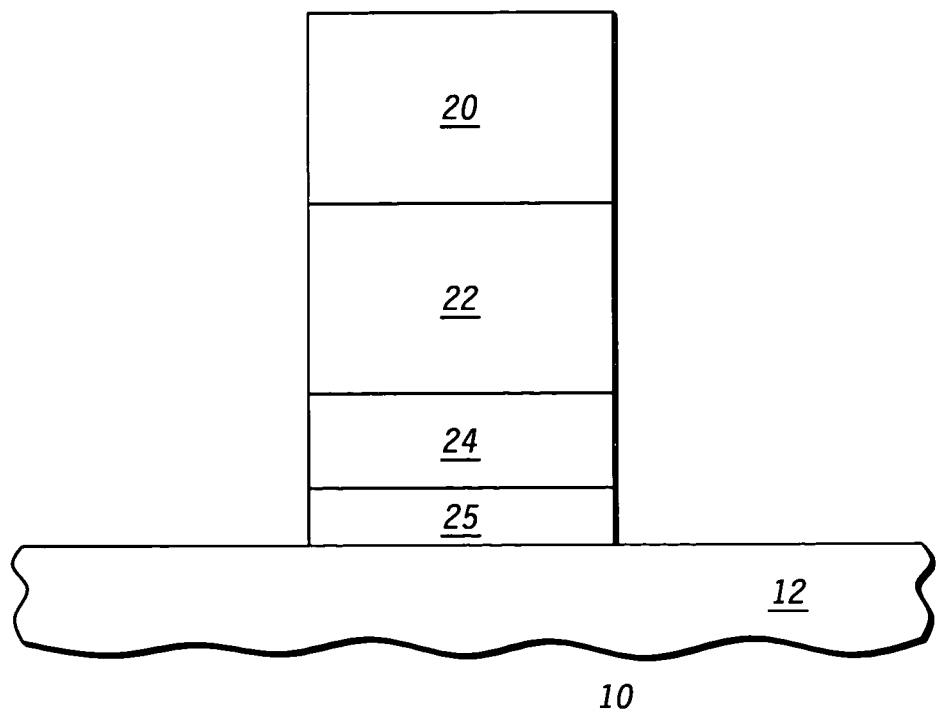
FIG. 6 illustrates the semiconductor device of FIG. 5 after etching the dielectric layer in accordance with an embodiment of the present invention.

After removing the footings, the dielectric layer 14 is patterned as shown in FIG. 6 to form a patterned dielectric layer 25, which will serve as the dielectric layer of the semiconductor device, which in one embodiment is a transistor. Thus, the patterned dielectric layer 25, may serve as the gate dielectric layer. The stack that includes the mask 20, the patterned top electrode 22, or the patterned metal layer 24 are used as a mask. Any chemistry that is selective to the materials in the stack and etches the dielectric layer 14 can be used. For example, an HF wet chemistry may be used to remove $SiO_2$ while a properly tuned $Cl_2$—$O_2$ dry chemistry or high temperature, non-plasma $Cl_2$ process may be used for $HfO_2$.

After forming the patterned dielectric layer 14, further processing known to a skilled artisan is performed. Since the subsequent steps are well known and an understanding of them is not necessary to understand the invention as described in the claims, such processing will only be briefly discussed. After forming the patterned dielectric layer 14, the mask 20 is removed. (Optionally, the mask 20 can be removed at any time after patterning the conductive layer 18 if not necessary to protect the exposed surface of the patterned conductive layer 22, if present, or the patterned metal layer 24 if the conductive layer 18 is not present. Also, while not shown in the figures, the mask 20 may be horizontally trimmed to create control electrodes with smaller CDs. Also, mask 20 may suffer erosion during the etch processes.) Subsequent processing also includes forming source/drain regions within or above the semiconductor, substrate 12 and forming contacts and interconnects to couple the semiconductor device 10 to other semiconductor devices. In addition, dielectric layers will need to be formed between interconnects to isolate the interconnects from other features, if needed. Any other additional processing known to a skilled artisan may also be performed.

By now it should be appreciated that there has been provided a method for patterning metal control electrodes, especially metal control electrodes over metal oxides. Gate CD and profile control are improved for the metal layer when using the above two-step processing. In addition, the following benefits may be obtained: sidewall residue is decreased and a process with better selectivity to metal oxide can be used.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one.

What is claimed is:

1. A method for forming a semiconductor device comprising:
    providing a semiconductor substrate;
    forming a metal oxide over the semiconductor substrate;
    forming a metal layer over the metal oxide;
    determining a predetermined critical dimension of the metal layer;
    performing a first etch to etch the metal layer down to the metal oxide and form footings at the sidewalls of the metal layer; and
    performing a second etch to remove the footings to target a predetermined critical dimension, wherein the second etch is selective to the metal oxide
    wherein the first etch is performed using a first chemistry, wherein the first chemistry comprises fluorine and is devoid of chlorine; and
    the second etch is performed using a second chemistry, wherein the second chemistry comprises chlorine.

2. The method of claim 1, wherein the metal layer is a control electrode.

3. The method of claim 1, wherein the first etch is selective to the metal oxide.

4. The method of claim 1, wherein the first etch is performed using a bias power less than approximately 30 Watts.

5. The method of claim 4, wherein the bias power is less than or equal to approximately 25 Watts.

6. The method of claim 1 further comprising:
    forming a conductive layer over the metal layer;
    etching the bulk of the conductive layer and leaving a portion in contact with the metal layer; and
    etching the portion using chemistry selective to the metal layer.

7. The method of claim 6, wherein the conductive layer comprises silicon.

8. The method of claim 1, wherein the semiconductor substrate comprises semiconductor-on-insulator (SOI).

9. The method of claim 1, wherein forming the metal layer over the metal oxide comprises forming a material selected from the group consisting of TiN and TaSiN.

10. The method of claim 1, wherein the metal layer comprises a material selected from the group consisting of a metal nitride and a metal silicon nitride.

11. A method for forming a semiconductor device comprising:
    providing a semiconductor substrate;
    forming a metal oxide over the semiconductor substrate;
    forming a metal layer over the metal oxide;
    determining a predetermined critical dimension of the metal layer;

performing a first etch to pattern the metal layer so that at least a portion of the metal layer has a tapered sidewall, wherein the metal layer has a length across the tapered sidewall that is greater than the predetermined critical dimension;

performing a second etch to pattern the metal layer so that substantially all of the metal layer has the predetermined critical dimension wherein the first etch is performed using a first chemistry, wherein the first chemistry comprises fluorine and is devoid of chlorine; and the second etch is performed using a second chemistry, wherein the second chemistry comprises chlorine.

12. The method of claim 11, wherein forming the metal layer over the metal oxide comprises forming a material selected from the group consisting of TiN and TaSiN.

13. The method of claim 11, wherein the first etch is performed using a bias power less than approximately 30 watts.

* * * * *